(12) United States Patent
Ding et al.

(10) Patent No.: US 12,217,655 B2
(45) Date of Patent: Feb. 4, 2025

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventors: Ding Ding, Hubei (CN); Liang Fang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 17/622,814

(22) PCT Filed: Dec. 20, 2021

(86) PCT No.: PCT/CN2021/139552
§ 371 (c)(1),
(2) Date: Dec. 25, 2021

(87) PCT Pub. No.: WO2023/108671
PCT Pub. Date: Jun. 22, 2023

(65) Prior Publication Data
US 2024/0029629 A1    Jan. 25, 2024

(30) Foreign Application Priority Data
Dec. 14, 2021    (CN) .......................... 202111530162.2

(51) Int. Cl.
*G09G 3/32*    (2016.01)
(52) U.S. Cl.
CPC ..................................... *G09G 3/32* (2013.01)

(58) Field of Classification Search
CPC ......... H01L 27/32; H01L 51/52; H01L 27/12; G06F 3/041; G06F 3/044; G06K 9/00
See application file for complete search history.

(56) References Cited

U.S. PATENT DOCUMENTS

2017/0069852 A1\*    3/2017    Kanamoto    ......... C07D 491/048
2019/0181206 A1    6/2019    Cao
(Continued)

FOREIGN PATENT DOCUMENTS

| CN | 103972260 A | 8/2014 |
| CN | 106019679 A | 10/2016 |

(Continued)

OTHER PUBLICATIONS

International Search Report in International application No. PCT/CN2021/139552, mailed on Sep. 14, 2022.
(Continued)

*Primary Examiner* — Michael A Faragalla
(74) *Attorney, Agent, or Firm* — PV IP PC; Wei Te Chung

(57) ABSTRACT

A display panel and a mobile terminal are provided. The display panel includes an array driving layer, a first electrode layer, a light-emitting layer, and a second electrode layer. The array driving layer includes a thin film transistor layer and a transparent conductive layer. The light-emitting layer includes a first pixel arranged on a normal display area and a second pixel arranged on a light-transmitting function display area. A via hole is formed in the light-transmitting function display area and between two adjacent second pixels. The transparent conductive layer includes a plurality of touch electrodes corresponding to the via hole.

19 Claims, 12 Drawing Sheets

(56) References Cited

U.S. PATENT DOCUMENTS

| | | | |
|---|---|---|---|
| 2019/0214440 A1 | 7/2019 | Lee | |
| 2019/0325190 A1* | 10/2019 | Cui | G06V 40/13 |
| 2019/0377445 A1* | 12/2019 | Jeong | G06F 3/0446 |
| 2021/0026493 A1* | 1/2021 | Kim | H10K 59/12 |
| 2021/0117032 A1* | 4/2021 | Chen | G06F 3/0448 |
| 2021/0200366 A1* | 7/2021 | Bok | H10K 59/122 |
| 2021/0280641 A1* | 9/2021 | Bang | H10K 50/844 |

FOREIGN PATENT DOCUMENTS

| | | |
|---|---|---|
| CN | 106033765 A | 10/2016 |
| CN | 108091671 A | 5/2018 |
| CN | 108227981 A | 6/2018 |
| CN | 108389883 A | 8/2018 |
| CN | 110147179 A | 8/2019 |
| CN | 110750177 A | 2/2020 |
| CN | 111240516 A | 6/2020 |
| CN | 111430439 A | 7/2020 |
| CN | 111725271 A | 9/2020 |
| CN | 112216731 A | 1/2021 |
| CN | 112271268 A | 1/2021 |
| CN | 112306302 A | 2/2021 |
| CN | 112435586 A | 3/2021 |
| CN | 113113454 A | 7/2021 |
| WO | 2019205333 A1 | 10/2019 |

OTHER PUBLICATIONS

Written Opinion of the International Search Authority in International application No. PCT/CN2021/139552, mailed on Sep. 14, 2022.

Chinese Office Action issued in corresponding Chinese Patent Application No. 202111530162.2 dated May 14, 2023, pp. 1-9.

Chinese Office Action issued in corresponding Chinese Patent Application No. 202111530162.2 dated Nov. 4, 2023, pp. 1-8.

* cited by examiner

DISPLAY PANEL AND MOBILE TERMINAL

FIELD OF DISCLOSURE

The present disclosure relates to the field of display technologies, in particular to a display panel and a mobile terminal.

BACKGROUND

With the increasing development of display technologies, in recent years, a touch function has become one of indispensable functions of a display device. A capacitive touch technology is widely used in various display devices, and its basic principle is to use tools such as fingers or stylus to generate capacitance with a touch screen. Electrical signals formed by capacitance changes before and after touch operations are used to determine whether the panel is touched and determine touch coordinates.

FIG. 1 is a schematic structural diagram showing a cross-sectional view of a conventional touch display panel. The touch display panel includes an array substrate 110, a light-emitting device layer 120, a thin film encapsulation layer 130, and a touch function layer 140. The touch function layer 140 includes a touch electrode 141, an insulating layer 142, and a touch signal line 143. In the touch display panel, since the touch function layer needs to be manufactured by using an additional mask, a manufacturing cost of the display panel will increase and a production efficiency will decrease.

SUMMARY OF DISCLOSURE

Embodiments of the present disclosure provide a display panel and a mobile terminal, which solve the technical problems of complicated manufacturing process and high manufacturing cost of a touch layer in a display panel.

To solve the above problems, technical solutions provided by the present disclosure are as follows:

An embodiment of the present disclosure provides a display panel, including: a normal display area and a light-transmitting function display area. The display panel includes:

an array driving layer including a thin film transistor layer and a transparent conductive layer disposed on a surface of the thin film transistor layer;

a first electrode layer disposed on a surface of the array driving layer;

a light-emitting layer disposed on a surface of the first electrode layer away from the array driving layer, and including a first pixel arranged on the normal display area and a second pixel arranged on the light-transmitting function display area;

a second electrode layer disposed on a surface of the light-emitting layer away from the array driving layer, and a via hole formed in the light-transmitting function display area and between two adjacent second pixels.

In the light-transmitting function display area, the transparent conductive layer includes a plurality of touch electrodes corresponding to the via hole.

In one embodiment, an orthographic projection of the touch electrode on the second electrode layer is within a corresponding via hole.

In one embodiment, the touch electrodes include a plurality of touch sub-electrodes arranged at intervals, an orthographic projection of the touch sub-electrode on the light-emitting layer is outside the second pixel, any two adjacent touch sub-electrodes are electrically connected, the via hole includes a plurality of sub-via holes corresponding to the plurality of touch sub-electrodes, and an orthographic projection of the touch sub-electrode on the second electrode layer is within the corresponding sub-via hole.

In one embodiment, in one of the touch sub-electrodes and a corresponding one of the sub-via holes, the touch sub-electrode and the sub-via hole have a same shape, and/or a line connecting a center of the touch sub-electrode and a center of the corresponding sub-via hole is perpendicular to the display panel.

In one embodiment, the shape of the sub-via hole is square, rectangular, circular, elliptical, or triangular.

In one embodiment, the thin film transistor layer includes a first thin film transistor corresponding to the first pixel and a second thin film transistor corresponding to the second pixel;

the first electrode layer includes a first sub-electrode corresponding to the first pixel and a second sub-electrode corresponding to the second pixel; and in the light-transmitting function display area, the second sub-electrode is electrically connected to a corresponding second thin film transistor through the transparent conductive layer.

In one embodiment, the transparent conductive layer includes a first transparent conductive sublayer and a second transparent conductive sublayer.

In one embodiment, the first transparent conductive sublayer includes the plurality of touch electrodes, the second transparent conductive sublayer includes a plurality of touch traces, and each of the touch traces is electrically connected to a corresponding touch electrode.

In one embodiment, the plurality of touch electrodes include a plurality of first sub-touch electrodes and a plurality of second sub-touch electrodes;

the plurality of first sub-touch electrodes include a plurality of first sub-touch electrode groups arranged along a first direction, one of the first sub-touch electrode groups includes at least two of the first sub-touch electrodes arranged along a second direction, and two adjacent first sub-touch electrodes are electrically connected through a first bridge wiring; and the plurality of second sub-touch electrodes include a plurality of second sub-touch electrode groups arranged along the second direction, one of the second sub-touch electrode groups includes at least two of the second sub-touch electrodes arranged along the first direction, and two adjacent second sub-touch electrodes are electrically connected through a second bridge wiring.

In one embodiment, the first transparent conductive sublayer includes the plurality of first sub-touch electrodes, the plurality of second sub-touch electrodes, and the first bridge wiring, and the second transparent conductive sublayer includes the second bridge wiring.

In one embodiment, the first transparent conductive sublayer includes the plurality of first sub-touch electrodes and the first bridge wiring, and the second transparent conductive sublayer includes the plurality of second sub-touch electrodes and the second bridge wiring.

In one embodiment, the transparent conductive layer further includes a third transparent conductive sublayer, the third transparent conductive sublayer includes a shielding layer, and the shielding layer is disposed between the touch electrode and the thin film transistor layer.

In one embodiment, in one unit area, a number of the second pixels is the same as a number of the first pixels.

In one embodiment, the transparent conductive layer is made of indium tin oxide, nano silver, or carbon nanotubes.

In one embodiment, the thin film transistor layer includes a buffer layer, an active layer, a first gate insulating layer, a first gate layer, a second gate insulating layer, a second gate layer, an interlayer insulating layer, a source-drain layer, and a planarization layer which are sequentially stacked.

In one embodiment, the light-emitting layer includes a hole injection layer, a hole transport layer, a light-emitting material layer, an electron transport layer, and an electron injection layer which are sequentially stacked.

An embodiment of the present disclosure also provides a mobile terminal, including a display panel and a terminal body. The terminal body and the display panel are assembled together.

The display panel includes:
- an array driving layer including a thin film transistor layer and a transparent conductive layer disposed on a surface of the thin film transistor layer;
- a first electrode layer disposed on a surface of the array driving layer;
- a light-emitting layer disposed on a surface of the first electrode layer away from the array driving layer, and including a first pixel arranged on the normal display area and a second pixel arranged on the light-transmitting function display area;
- a second electrode layer disposed on a surface of the light-emitting layer away from the array driving layer, and a via hole formed in the light-transmitting function display area and between two adjacent second pixels.

In the light-transmitting function display area, the transparent conductive layer includes a plurality of touch electrodes corresponding to the via hole.

In one embodiment, an orthographic projection of the touch electrode on the second electrode layer is within a corresponding via hole.

In one embodiment, the touch electrodes include a plurality of touch sub-electrodes arranged at intervals, an orthographic projection of the touch sub-electrode on the light-emitting layer is outside the second pixel, any two adjacent touch sub-electrodes are electrically connected, the via hole includes a plurality of sub-via holes corresponding to the plurality of touch sub-electrodes, and an orthographic projection of the touch sub-electrode on the second electrode layer is within the corresponding sub-via hole.

In one embodiment, the thin film transistor layer includes a first thin film transistor corresponding to the first pixel and a second thin film transistor corresponding to the second pixel;
- the first electrode layer includes a first sub-electrode corresponding to the first pixel and a second sub-electrode corresponding to the second pixel; and
- in the light-transmitting function display area, the second sub-electrode is electrically connected to a corresponding second thin film transistor through the transparent conductive layer.

The display panel includes the normal display area and the light-transmitting function display area. In the light-transmitting function display area, the transparent conductive layer is used to form the touch electrodes. A touch function of the light-transmitting function display area is realized without affecting a light-transmitting characteristic of the area. In addition, the second electrode layer disposed on the light-emitting layer is provided with the via hole at a position corresponding to the touch electrode to ensure a normal transmission of touch sensing signals, thereby achieving a good touch performance.

DETAILED DESCRIPTION

The technical solutions in the embodiments of the present disclosure will be clearly and completely described below in conjunction with the drawings in the embodiments of the present disclosure. Apparently, the described embodiments are only a part of the embodiments of the present disclosure, rather than all the embodiments. Based on the embodiments in the present disclosure, all other embodiments obtained by those skilled in the art without creative efforts shall fall within the scope of protection of the present disclosure.

In the description of the present disclosure, it should be understood that directions or location relationships indicated by terms "center", "longitudinal", "transverse", "length", "width", "thickness", "upper", "lower", "front", "rear", "left", "right", "vertical", "horizontal", "top", "bottom", "inner", and "outer", are directions or location relationships shown based on the accompanying drawings, are merely used for the convenience of describing the present disclosure and simplifying the description, but are not used to indicate or imply that a device or an element must have a particular direction or must be constructed and operated in a particular direction, and therefore, cannot be understood as a limitation to the present disclosure. In addition, terms "first" and "second" are merely used to describe the objective, but cannot be understood as indicating or implying relative importance or implying a quantity of indicated technical features. Therefore, features limited by "first" and "second" may indicate explicitly or implicitly that one or more features are included. In the description of the present disclosure, unless otherwise specifically limited, "multiple" means at least two.

In the present disclosure, the word "example" is used to represent giving an example, an illustration, or a description. Any embodiment described as "example" in the present disclosure should not be explained as being more preferred or having more advantages than another embodiment. To enable any person skilled in the art to implement and use the present disclosure, the following description is provided. In the following description, details are listed for the purpose of explanation. It should be understood that a person of ordinary skill in the art can realize that the present disclosure can also be implemented when these specific details are not used. In other examples, commonly known structures and processes are not described in detail, to prevent unnecessary details from making descriptions of the present disclosure obscure. Therefore, the present disclosure is not intended to limit the shown embodiments, but is in accord with the broadest scope of the principles and features disclosed in the present disclosure.

Figure 1:
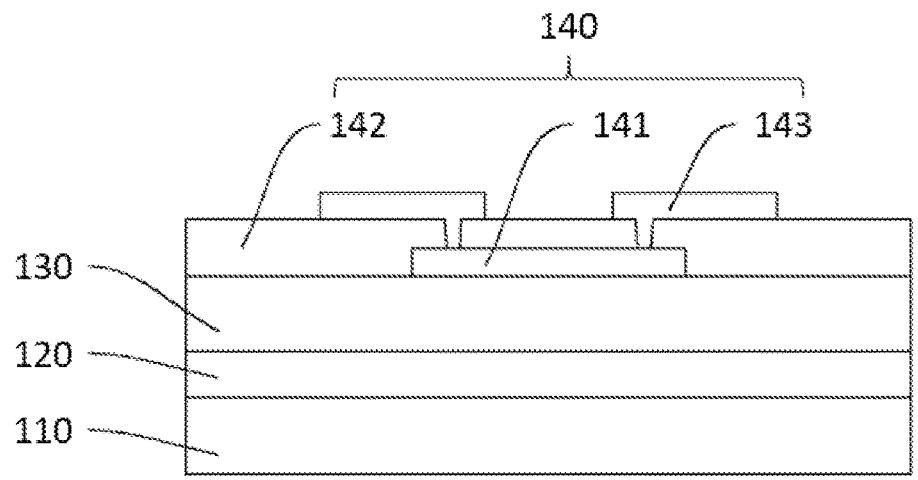
FIG. 1 is a schematic structural diagram showing a cross-sectional view of a touch display panel in the prior art.
Figure 2:
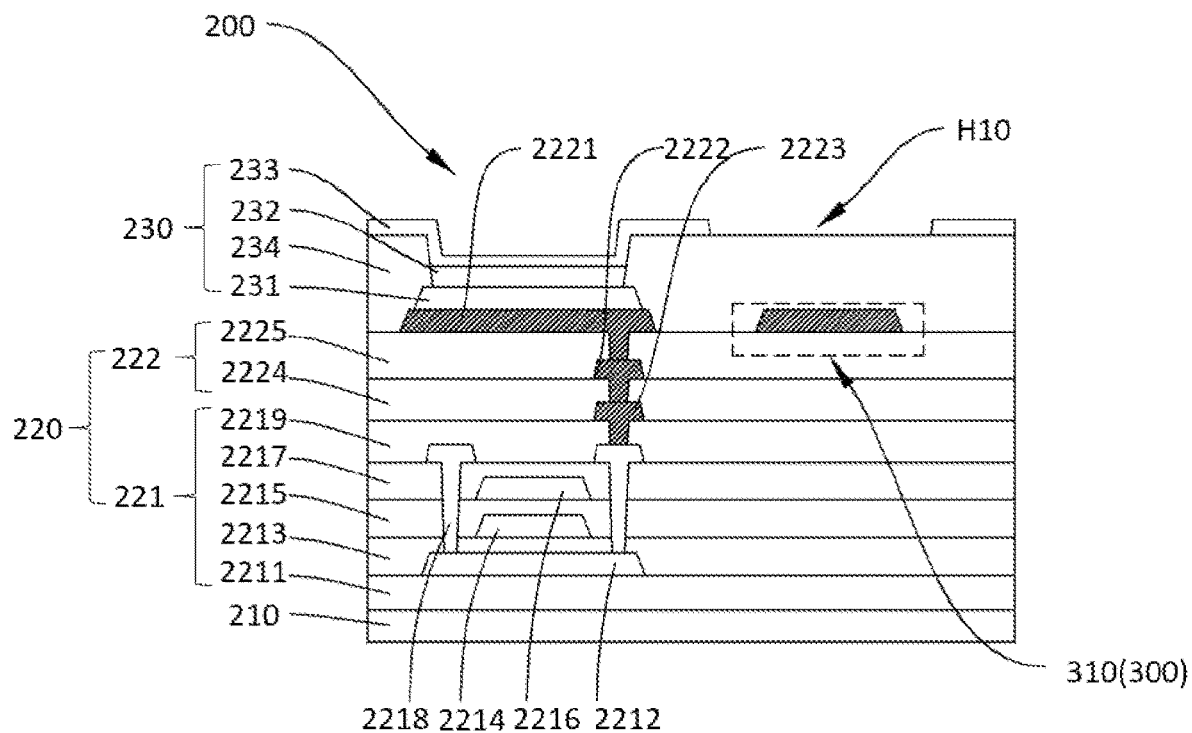
FIG. 2 is a schematic structural diagram showing a cross-sectional view of a touch display panel of an embodiment of the present disclosure.
Figure 3:
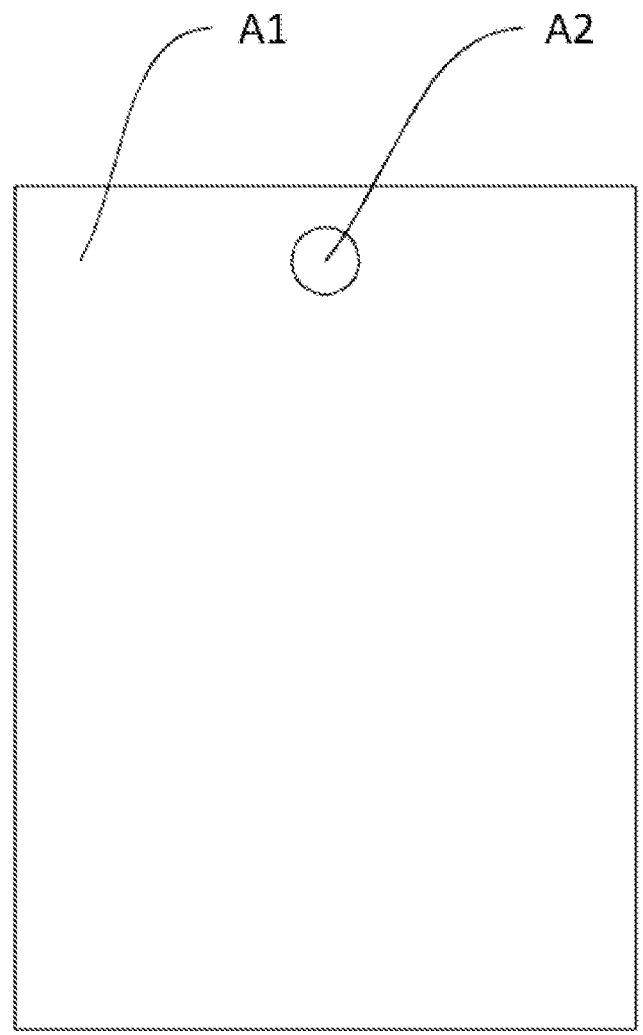
FIG. 3 is a schematic diagram of a planar structure of a display panel of an embodiment of the present disclosure.

An embodiment of the present disclosure provides a display panel, and a cross-sectional structure of the display panel shown in FIG. 2 and a planar structure of the display panel shown in FIG. 3 are described in detail below.

Specifically, the display panel 200 includes a normal display area A1 and a light-transmitting function display area A2. The light-transmitting function display area A2 is usually arranged inside the normal display area A1, and is usually used to place photosensitive devices required by the display panel, such as an under-screen camera. Therefore, a light transmittance of the light-transmitting function display area A2 is greater than that of the normal display area A1, so as to meet photosensitive requirements of the photosensitive devices.

The display panel 200 includes a substrate 210, an array driving layer 220, a first electrode layer 231, a light-emitting layer 232, and a second electrode layer 233. The first electrode layer 231, the light-emitting layer 232, and the second electrode layer 233 form a light-emitting device layer 230.

The array driving layer 220 is disposed on the substrate 210 and includes a thin film transistor layer 221 and a transparent conductive layer 222 disposed on a surface of the thin film transistor layer away from the substrate 210. The first electrode layer 231 is disposed on a surface of the array driving layer 220 away from the substrate. The light-emitting layer 232 is disposed on a surface of the first electrode layer 231 away from the array driving layer 220, and includes a first pixel disposed in the normal display area A1 and a second pixel disposed in the light-transmitting function display area A2. The second electrode layer 233 is disposed on a surface of the light-emitting layer 232 away from the first electrode layer 231. The second electrode layer 233 is provided with a via hole H10 in the light-transmitting function display area A2 and formed between two adjacent second pixels. Furthermore, in the light-transmitting function display area A2, the transparent conductive layer 222 includes a plurality of touch electrodes 310 corresponding to the via hole H10. The plurality of the touch electrodes 310 form a touch layer 300 that realizes a touch function.

The display panel of this embodiment includes the normal display area A1 and the light-transmitting function display area A2. In the light-transmitting function display area A2, the touch electrodes 310 are formed from the transparent conductive layer 222. The touch function of the light-transmitting function display area A2 is realized without affecting a light-transmitting characteristic of the area, so as to meet light-sensing requirements of the photosensitive devices arranged in the light-transmitting function display area A2. In addition, the second electrode layer 233 is disposed on the touch electrodes 310, that is, a side closer to the finger touch. Thus, when a touch operation is performed, the second electrode layer 233 between a finger and the touch electrode 310 will form a certain shielding effect on a signal generated when the finger is touched, resulting in a reduction in a capacitance formed between the finger and the touch electrode 310 and reducing a sensitivity of the touch electrode 310. It even makes the touch electrode 310 unable to respond to finger sensing. Therefore, the via hole H10 is provided at the position of the second electrode layer 233 corresponding to the touch electrode 310 to ensure a normal transmission of touch sensing signals, thereby achieving a good touch performance.

It is supplemented that the substrate 210 is a flexible substrate or a rigid substrate according to actual process requirements. The flexible substrate is usually a polyimide film. Furthermore, in order to ensure a certain strength and barrier performance to an external environment, the flexible substrate may be a double-layer polyimide film, and an inorganic layer is dispsoed between the two polyimide films.

The thin film transistor layer 221 may generally include a buffer layer 2211, an active layer 2212, a first gate insulating layer 2213, a first gate layer 2214, a second gate insulating layer 2215, a second gate layer 2216, an interlayer insulating layer 2217, a source-drain layer 2218, and a planarization layer 2219 that are sequentially stacked and arranged. Of course, the thin film transistor layer 221 may also have other structures, which are only illustratively described here.

The light-emitting layer 232 usually includes a hole injection layer, a hole transport layer, a light-emitting material layer, an electron transport layer, and an electron injection layer that are stacked in sequence.

The display panel also includes a pixel definition layer 234 for defining each pixel area.

In some embodiments, in order to completely eliminate the shielding effect of the second electrode layer 233 on the touch sensing signal, the via hole H10 of the second electrode layer 233 is set to be larger. Specifically, an orthographic projection of the touch electrodes 310 on the second electrode layer 233 is within the corresponding via hole H10.

Figure 4:
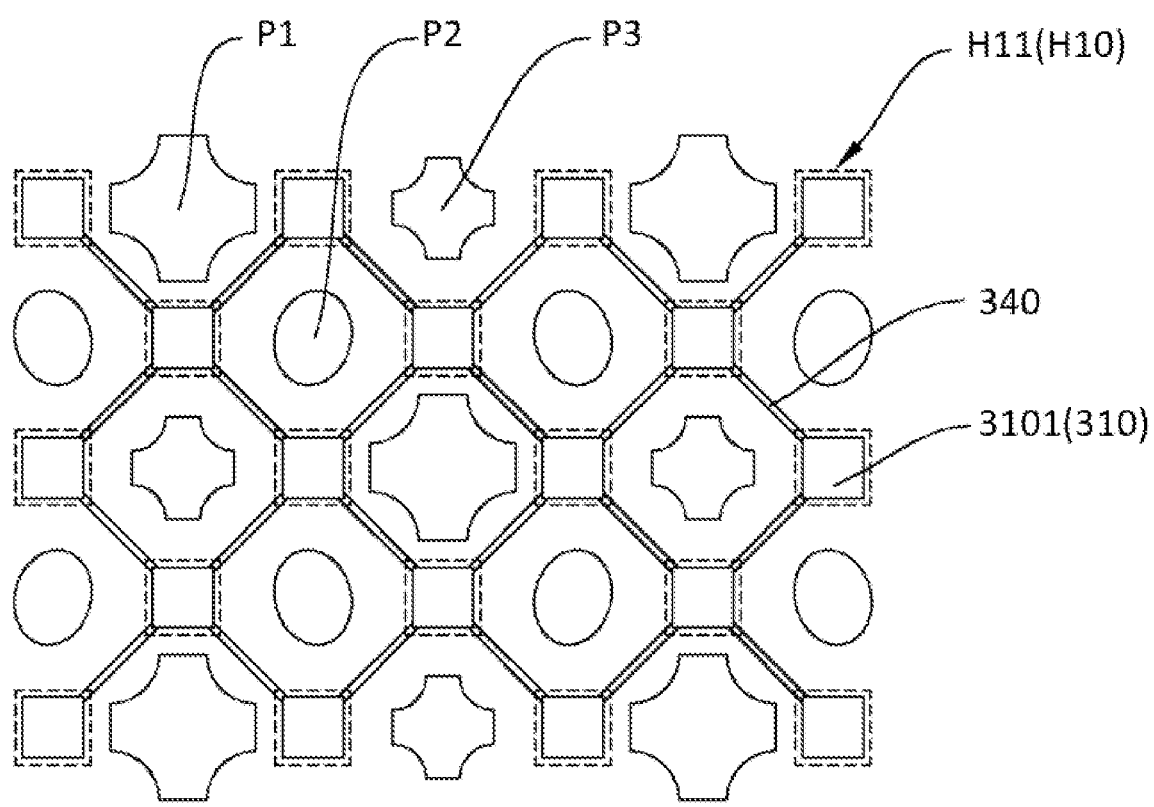
FIG. 4 is a schematic diagram of a planar structure of touch electrodes of a display panel of an embodiment of the present disclosure.

In some embodiments, refer to a schematic diagram of a planar structure of pixel electrodes shown in FIG. 4. The touch electrodes 310 include a plurality of touch sub-electrodes 3101 arranged at intervals, and two adjacent touch sub-electrodes 3101 are electrically connected through a connecting part 340 to form grid-shaped touch electrodes, so as to prevent being arranged in an area of the light-transmitting display area corresponding to the second pixel, for example, including a first sub-pixel P1, a second sub-pixel P2, and a third sub-pixel P3. The touch sub-electrodes 3101 and the connecting parts 340 are disposed in gap regions of the first sub-pixel P1, the second sub-pixel P2, and the third sub-pixel P3. The via hole H10 includes sub-via holes H11 corresponding to the plurality of touch sub-electrodes 3101. An orthographic projection of the touch sub-electrode 3101 on the second electrode layer 233 within the sub-via hole H11, thereby eliminating the shielding of the touch sensing signal by the second electrode layer 233. With this arrangement, on the other hand, after the second electrode layer 233 is provided with the sub-via holes H11, a remaining part is still a whole, and the problem of uneven display caused by voltage drop due to the division of the second electrode layer 233 will not occur.

In some embodiments, in order to facilitate the arrangement of the sub-via hole H11, in one of the touch sub-electrodes 3101 and the corresponding one of the sub-via holes H11, the touch sub-electrode 3101 and the sub-via hole H11 have the same shape. For example, it can be square, rectangular, circular, elliptical, or triangular.

Furthermore, a line connecting a center of the touch sub-electrode 3101 and a center of the corresponding sub-via hole H11 is perpendicular to the display panel.

In some embodiments, the thin film transistor layer 221 includes a first thin film transistor corresponding to the first pixel and a second thin film transistor corresponding to the second pixel. The first thin film transistor and the second thin film transistor are both arranged outside the light-transmitting function display area A2 to avoid a loss of the light-transmitting function display area A2 caused by metal traces in the thin film transistor layer 221.

The first electrode layer 231 includes a first sub-electrode corresponding to the first pixel and a second sub-electrode corresponding to the second pixel. The first sub-electrode is correspondingly arranged in the normal display area A1. The second sub-electrode is correspondingly arranged in the light-transmitting function display area A2.

In the light-transmitting function display area A2, the second sub-electrode is electrically connected to the corresponding second thin film transistor through the transparent conductive layer 222.

The light-transmitting function display area A2 needs to have a higher light transmittance, and the thin film transistor layer used to drive the display includes more metal layers, which will cause the loss of light transmittance. Thus, the second thin film transistor for driving the light-transmitting function display area A2 is disposed outside the light-transmitting function display area A2, and the first sub-electrode is electrically connected to the second thin film transistor through the transparent conductive layer 222, so as to ensure the high light transmittance of the light-transmitting function display area A2. Furthermore, the transparent conductive layer 222 and the touch electrodes 310 are arranged in the same layer, that is, are formed by a same process. Therefore, the touch function of the light-transmitting function display area A2 is realized without increasing the manufacturing process and cost of the display panel, and the requirement of high light transmittance of the light-transmitting function display area A2 is met.

It is supplemented that the first sub-electrode is a reflective electrode, which has a high reflectivity and is used to reflect and emit the luminous light, thereby ensuring a high luminous efficiency of the normal display area. The second sub-electrode is a light-transmitting electrode, which has a higher light transmittance, so as to meet the higher light transmittance requirement of the light-transmitting function display area.

In some embodiments, material of the transparent conductive layer 222 is selected from conductive materials with high light transmittance conventionally used in the art, such as indium tin oxide, nano silver, and carbon nanotubes.

Figure 5:
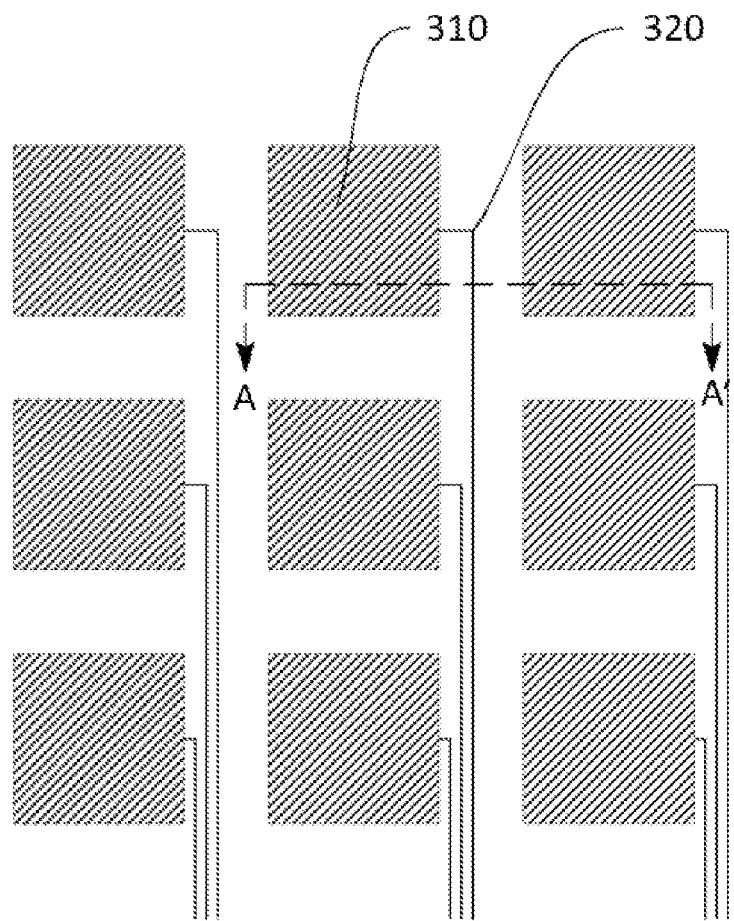
FIG. 5 is a schematic structural diagram showing a cross-sectional view of a touch layer of a display panel of an embodiment of the present disclosure.

In some embodiments, refer to a schematic diagram of a planar structure of a touch layer shown in FIG. 5. The touch layer 300 includes a plurality of touch electrodes 310. The touch electrodes 310 are arranged in an array and are insulated from one another. The touch electrodes 310 may be in a positive direction shown in the figure, or may have other shapes. Referring to FIG. 2, the transparent conductive layer 222 includes a first transparent conductive sublayer 2221, and the first transparent conductive sublayer 2221 includes the plurality of touch electrodes 310. Of course, according to actual process requirements, the transparent conductive layer 222 may include multiple transparent conductive sublayers. For example, as shown in the figure, the transparent conductive layer 222 includes the first transparent conductive sublayer 2221, a second transparent conductive sublayer 2222, and a third transparent conductive sublayer 2223. Insulating layers are arranged between two adjacent transparent conductive sublayers, such as a first insulating layer 2224 and a second insulating layer 2225 as shown in the figure. Moreover, the touch electrodes 310 can also be arranged in the second transparent conductive sublayer 2222 or the third transparent conductive sublayer 2223. That is, the second transparent conductive sublayer 2222 includes the plurality of touch electrodes 310, or the third transparent conductive sublayer 2223 includes the plurality of touch electrodes 310.

Furthermore, refer to FIG. 5, the touch layer further includes a plurality of touch traces 320, one of the touch traces 320 is electrically connected to a corresponding touch electrode 310, that is, a self-capacitive touch structure is formed.

Figure 6:
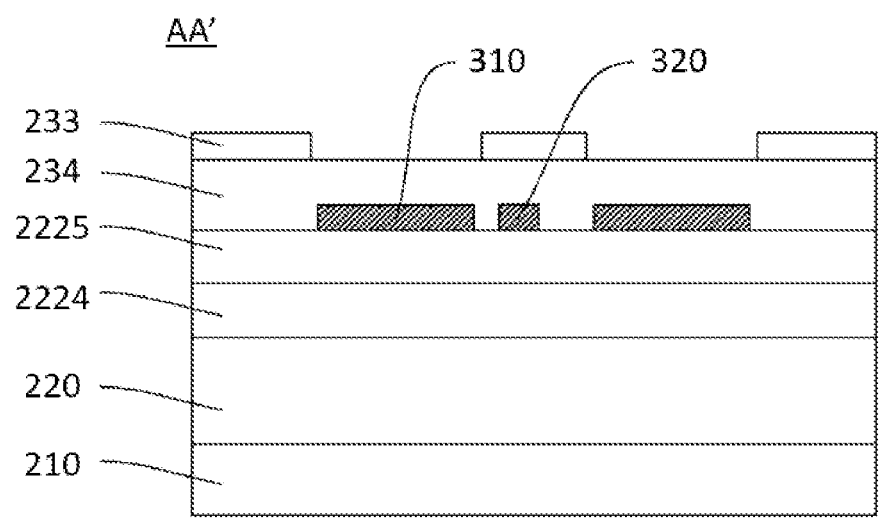
FIG. 6 is a schematic structural diagram showing a cross-sectional view of another display panel of an embodiment of the present disclosure.

In one embodiment, the touch traces 320 and the touch electrodes 310 are arranged in the same layer. For details, refer to FIG. 6, which is a schematic diagram of a cross-sectional structure of AA' in FIG. 5. That is, the first transparent conductive sublayer includes not only the touch electrodes 310 but also the touch traces 320.

Figure 7:
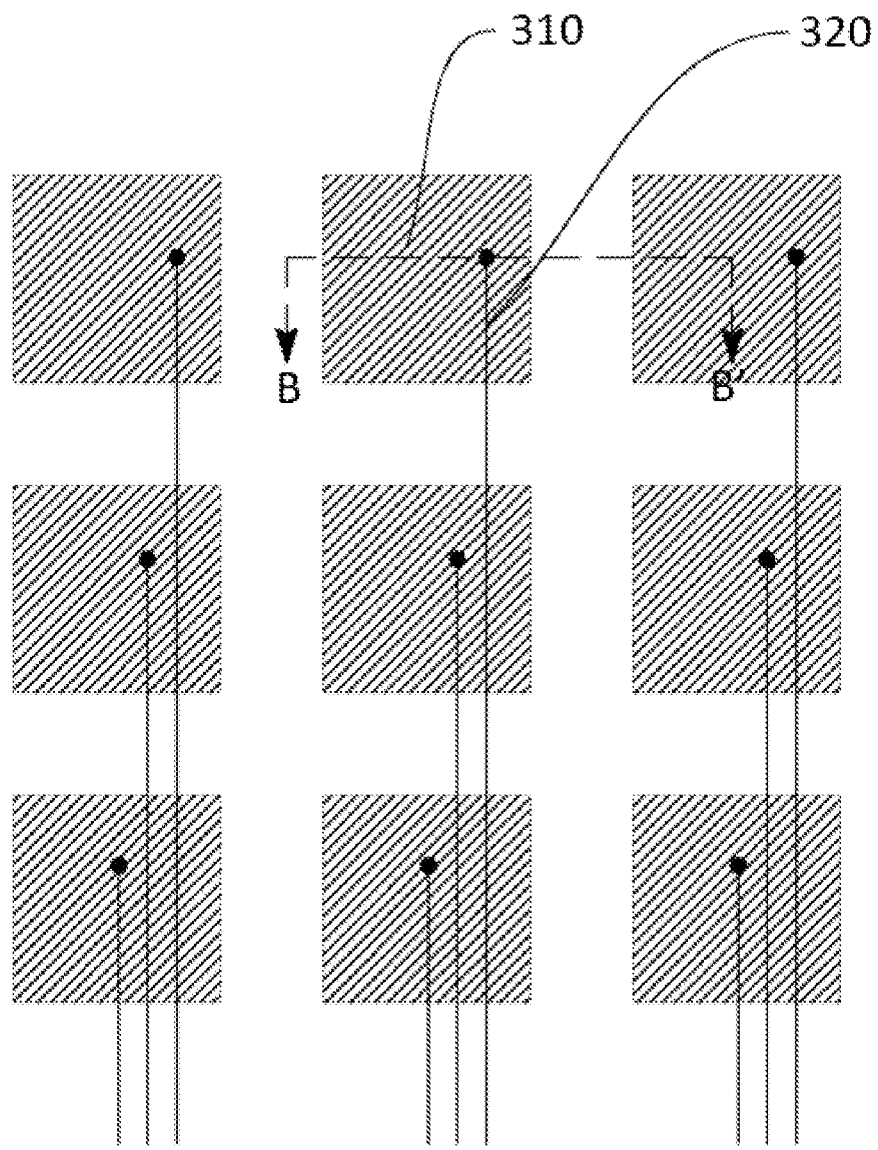
FIG. 7 is a schematic structural diagram showing a cross-sectional view of a touch layer of another display panel of an embodiment of the present disclosure.

In some embodiments, refer to FIG. 7, which is a schematic diagram of a planar structure of another touch layer. In order to facilitate the arrangement of the touch traces 320, the touch traces 320 and the touch electrodes 310 may be arranged in different layers. That is, the transparent conductive layer 222 also includes the second transparent conductive sublayer 2222. The second transparent conductive sublayer 2222 includes the plurality of touch traces 320. For details, refer to FIG. 8, the first transparent conductive sublayer 2221 and the second transparent conductive sublayer 2222 include the touch layer 300. For details, refer to FIG. 9, which is a schematic diagram of a cross-sectional structure of BB' in FIG. 7, the touch electrode 310 is disposed on the touch trace 320, and are electrically connected through a via formed in the first insulating layer 2224.

It is understandable that a description of the first transparent conductive sublayer including the first electrode, and the second transparent conductive sublayer including touch trace, which is only to indicate that the touch layer formed by the touch electrodes and touch traces and the two transparent conductive sublayers are arranged in the same layer, and the touch electrodes and touch traces are arranged in different layers. When the transparent conductive layer includes multiple layers of the transparent conductive sublayers, two layers of the transparent conductive sublayers can be selected for setting.

Figure 8:
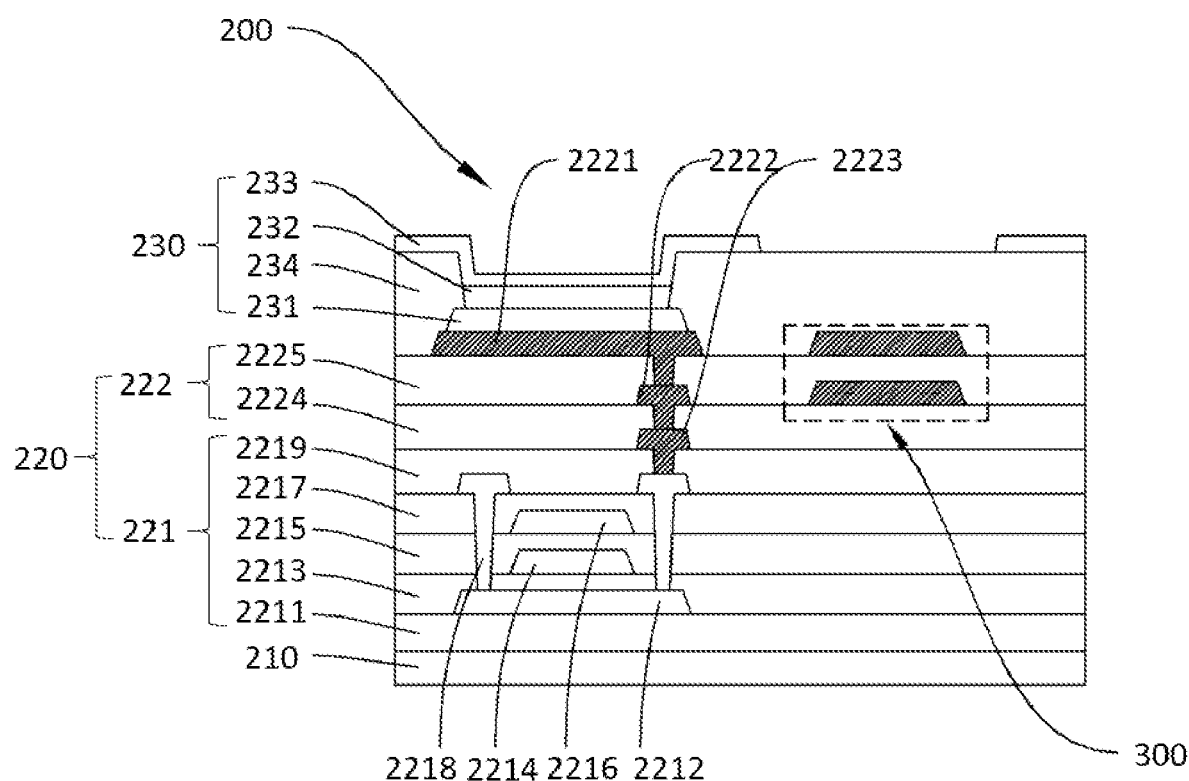
FIG. 8 is a schematic structural diagram showing a cross-sectional view of another display panel of an embodiment of the present disclosure.
Figure 9:
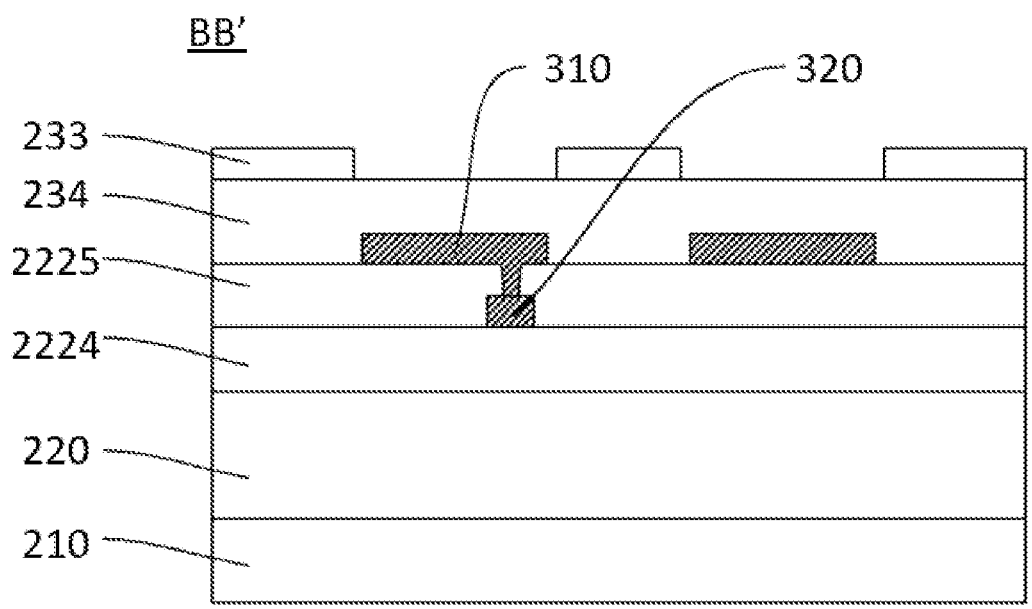
FIG. 9 is a schematic structural diagram showing a cross-sectional view of another display panel of an embodiment of the present disclosure.
Figure 10:
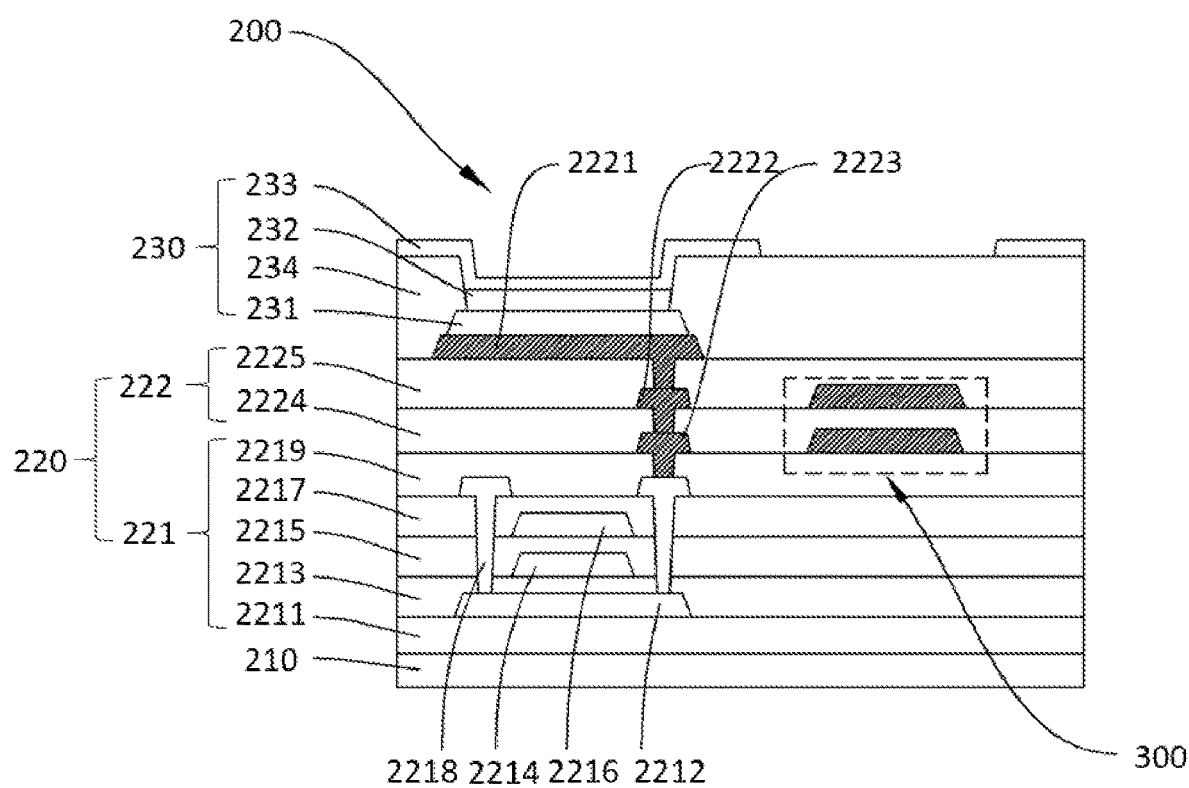
FIG. 10 is a schematic structural diagram showing a cross-sectional view of another display panel of an embodiment of the present disclosure.
Figure 11:
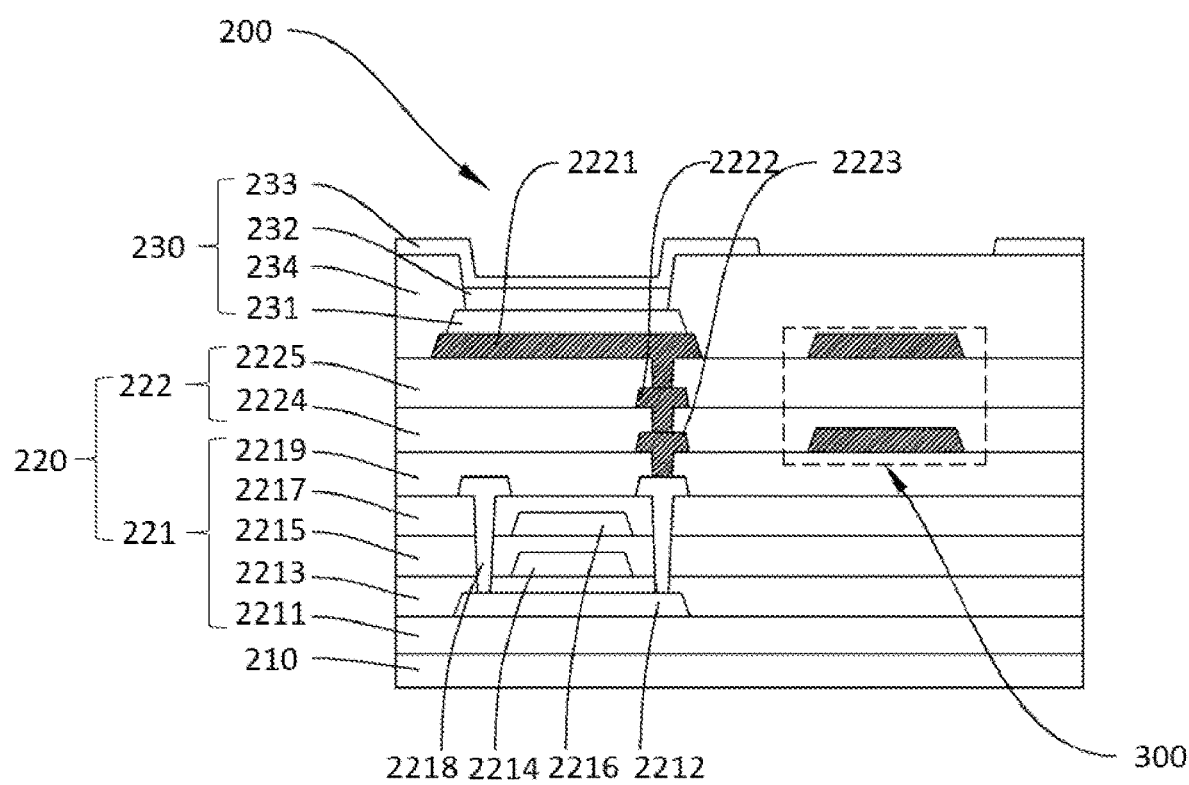
FIG. 11 is a schematic structural diagram showing a cross-sectional view of another display panel of an embodiment of the present disclosure.

Here, three transparent conductive sublayers are used as an example to illustrate, in addition to the arrangement shown in FIG. 8, it may also be shown in FIG. 10, the second transparent conductive sublayer 2222 and the third transparent conductive sublayer 2223 include the touch layer 300. As shown in FIG. 11, the first transparent conductive sublayer 2221 and the third transparent conductive sublayer 2223 include the touch layer 300.

In some embodiments, in addition to the aforementioned self-capacitive touch structure, the touch layer can also be configured as a mutual-capacitive touch structure. Specifically, refer to a schematic diagram of a planar structure of a touch layer shown in FIG. 12. The plurality of touch electrodes 310 include a plurality of first sub-touch electrodes 311 and a plurality of second sub-touch electrodes 312.

The plurality of first sub-touch electrodes 311 include a plurality of first sub-touch electrode groups 311G arranged along a first direction X. One of the first sub-touch electrode groups 311G includes at least two of the first sub-touch electrodes 311 arranged along a second direction Y. The plurality of second sub-touch electrodes 312 include a plurality of second sub-touch electrode groups 312G arranged along the first direction X. One of the second sub-touch electrode groups 312G includes at least two of the second sub-touch electrodes 312 arranged along the second direction Y. The first sub-touch electrode groups 311G and the second sub-touch electrode groups 312G are alternately arranged along the first direction X.

The plurality of touch traces 320 includes a plurality of first touch traces 321 and a plurality of second touch traces 322. At least one of the first touch traces 321 is correspondingly connected to one of the first sub-touch electrode groups 311G. At least one of the second touch traces 322 is correspondingly connected to the second sub-touch electrode groups 312G. The first touch traces 321 and the second touch traces 322 extend along the second direction Y and are arranged between the first sub-touch electrode groups 311G and the second sub-touch electrode groups 312G. Two first sides of the first sub-touch electrode group 311G in the first direction X are each provided with the first touch trace 321. The first touch trace 321 extends along the second direction Y. The first touch trace 321 at one of the two first sides is connected to odd-numbered ones of the first sub-touch electrodes 311 in the first sub-touch electrode group 311G. The first touch trace 321 at the other one of the two first sides is connected to even-numbered ones of the first sub-touch electrodes 311 in the first sub-touch electrode group 311G. Each second sub-touch electrode groups 312G includes a plurality of touch units 3121. The touch unit 3121 includes three second sub-touch electrodes 312. Two second sides of the touch unit 3121 in the first direction X are each provided with the second touch trace 322. Two ends of the second touch trace 322 at one of the two second sides are connected to odd-numbered two of the three second sub-touch electrodes 312 respectively. Two of the second touch traces 322 at another one of the two second sides are extended in the second direction Y and connected to a remaining one of the three second sub-touch electrodes 312 and a first one of the odd-numbered two second sub-touch electrodes 312, respectively. A size of each of the plurality of first sub-touch electrodes 311 is equal. Sizes of the odd-numbered two second sub-touch electrodes 312 are less than a size of the remaining one of the three second sub-touch electrodes 312. Each of the plurality of first sub-touch electrode groups 311G and a corresponding one of the plurality of second sub-touch electrode groups 312G are formed to an electrode-group pair 31. A distance D1 between the first sub-touch electrode group 311G and the corresponding second sub-touch electrode group 312G in the electrode-group pair 31 is less than a distance D2 between the electrode-group pair 31 and another adjacent electrode-group pair 31.

Figure 12:
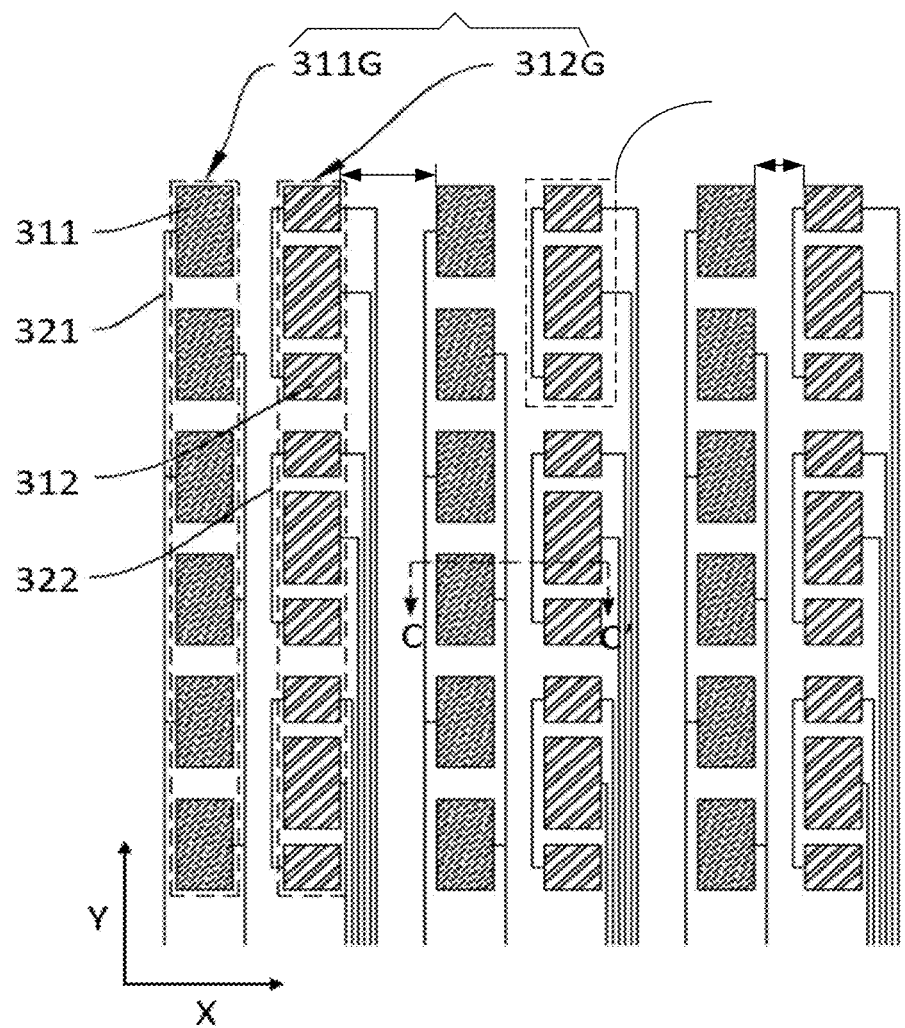
FIG. 12 is a schematic structural diagram showing a cross-sectional view of a touch layer of a display panel of an embodiment of the present disclosure.
Figure 13:
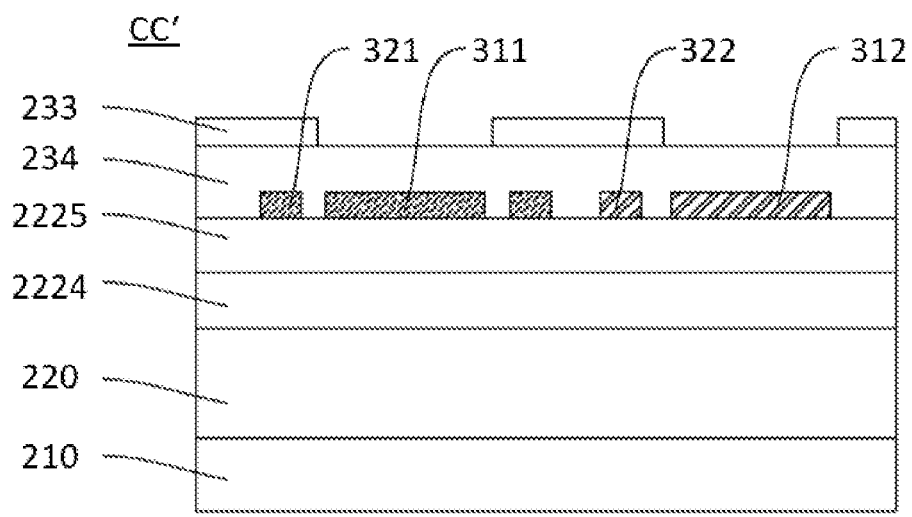
FIG. 13 is a schematic structural diagram showing a cross-sectional view of another display panel of an embodiment of the present disclosure.

FIG. 13 is a schematic diagram of a cross-sectional structure of CC' in FIG. 12. The first sub-touch electrodes 311, the second sub-touch electrodes 312, the first touch traces 321, and the second touch traces 322 are arranged in the same layer to form a mutual capacitive touch structure of the same layer. That is, the first transparent conductive sublayer 2221 includes the first sub-touch electrodes 311, the second sub-touch electrodes 312, the first touch traces 321, and the second touch traces 322. The touch layer 300 is only arranged on the same layer as the transparent conductive sublayer of the first layer, and the specific setting method can be referred to FIG. 2.

In some embodiments, in addition to the above-mentioned mutual capacitive touch structure of the same layer, the touch layer may also be configured as a mutual-capacitive touch structure of different layers. Specifically, refer to FIG. 14, which is a schematic diagram of a planar structure of a touch layer. The plurality of first sub-touch electrodes 311 include a plurality of first sub-touch electrode groups 311G arranged along the first direction X. One of the first sub-touch electrode groups 311G includes at least two of the first sub-touch electrodes 311 arranged along the second direction Y. Two adjacent first sub-touch electrodes 311 are electrically connected through a first bridge wiring 331.

The plurality of second sub-touch electrodes 312 includes a plurality of second sub-touch electrode groups 312G arranged along the second direction Y. One of the second sub-touch electrode groups 312G includes at least two of the second sub-touch electrodes 312 arranged along the first direction X. Two adjacent second sub-touch electrodes 312 are electrically connected through a second bridge wiring 332.

In this arrangement, the first bridge wiring 331 and the second bridge wiring 332 intersect. Therefore, the first bridge wiring 331 and the second bridge wiring 332 should be respectively arranged in the two transparent conductive sublayers to achieve insulation. That is, the touch layer is formed by two transparent conductive sublayers. For specific setting methods, refer to FIG. 8, FIG. 10, or FIG. 11, which will not be repeated here.

Figure 14:
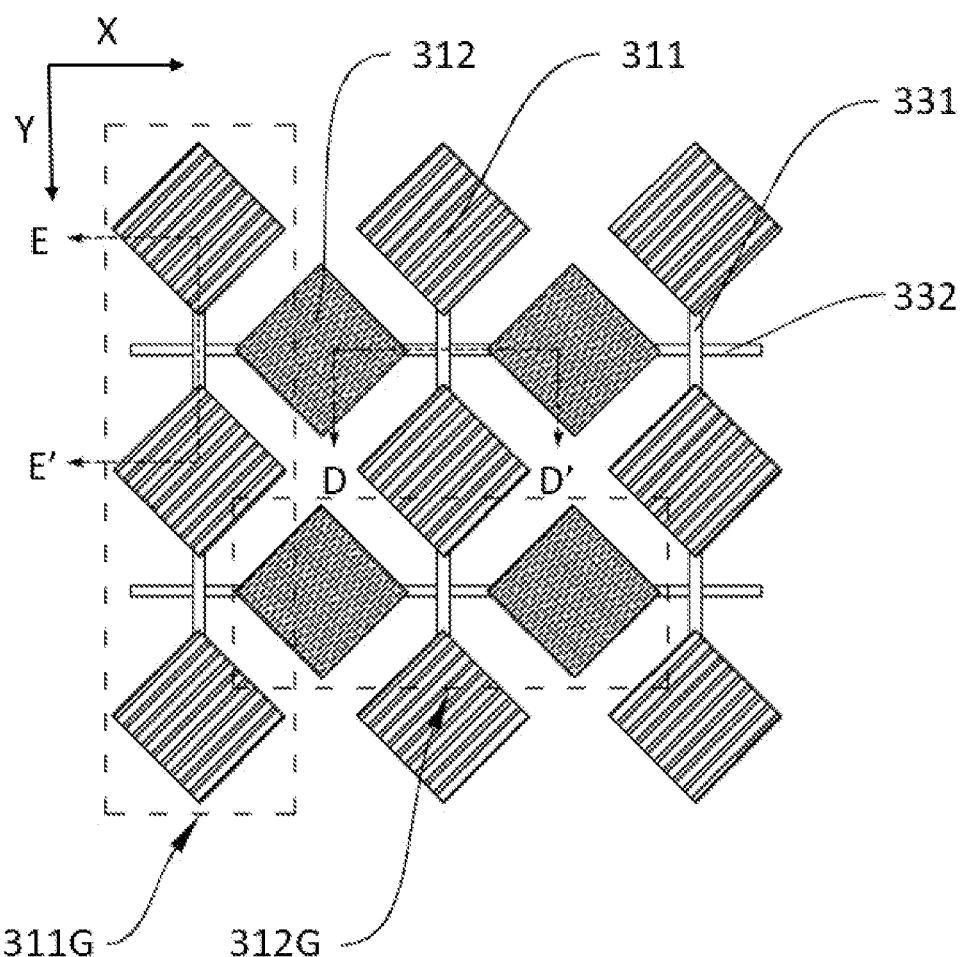
FIG. 14 is a schematic structural diagram showing a cross-sectional view of a touch layer of a display panel of an embodiment of the present disclosure.
Figure 15:
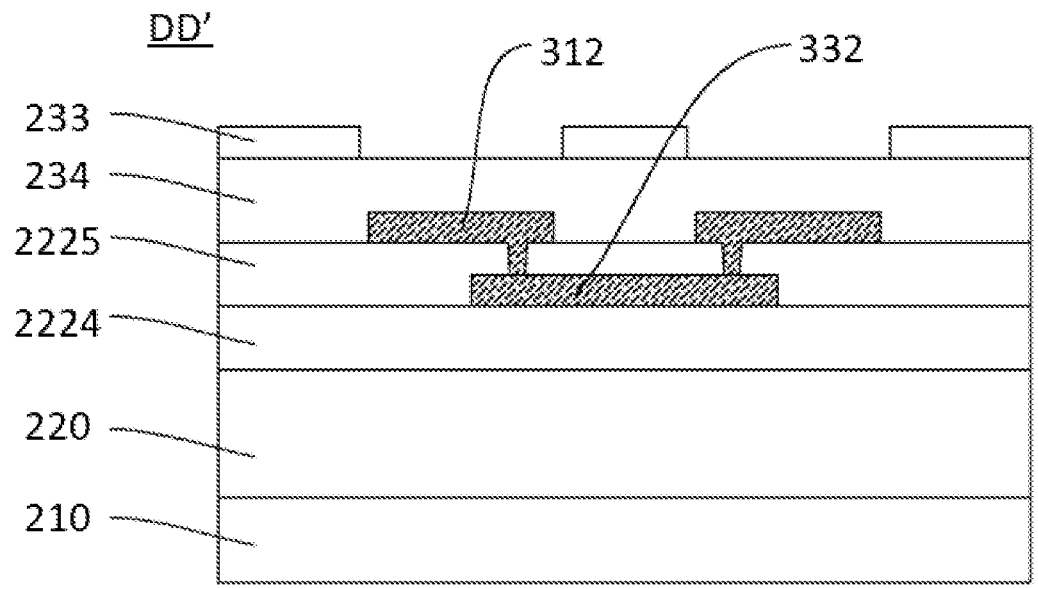
FIG. 15 is a schematic structural diagram showing a cross-sectional view of another display panel of an embodiment of the present disclosure.
Figure 16:
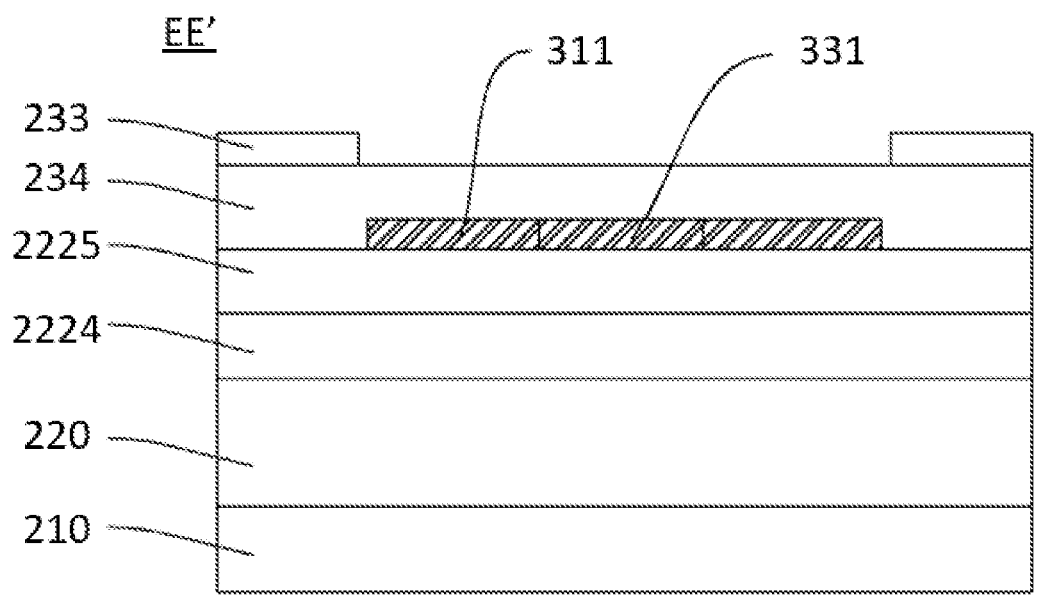
FIG. 16 is a schematic structural diagram showing a cross-sectional view of another display panel of an embodiment of the present disclosure.

Specifically, in one embodiment, please refer to FIG. 15 and FIG. 16, FIG. 15 is a schematic diagram of a cross-sectional structure of DD' in FIG. 14, and FIG. 16 is a schematic diagram of a cross-sectional structure of EE' in FIG. 14. The first sub-touch electrodes 311 and the first bridge wiring 331 are arranged in the same layer. The two are directly connected. The second sub-touch electrodes 312 and the second bridge wiring 332 are arranged in different layers. The two are connected through a via in the second insulating layer 2225. That is, the first transparent conductive sublayer includes the plurality of first sub-touch electrodes 311, the plurality of second sub-touch electrodes 312, and the first bridge wiring 331. The second transparent conductive sublayer includes the second bridge wiring 332.

In another embodiment, the first sub-touch electrodes and the second sub-touch electrodes are arranged in different layers. The first sub-touch electrodes and the first bridge wiring are arranged on the same layer, and the two are directly connected. The second sub-touch electrodes and the second bridge wiring are arranged on the same layer, and the two are directly connected. That is, the first transparent conductive sublayer includes the plurality of first sub-touch electrodes and the first bridge wiring. The second transparent conductive sublayer includes the plurality of second sub-touch electrodes and the second bridge wiring. The specific diagrams of drawings are not given here, which should be easily understood by those skilled in the art.

In some embodiments, electrical signals in the thin film transistor layer 221 may interfere with the touch electrodes on the upper layer to a certain degree. In order to further improve the touch performance of the touch electrodes, a shielding layer is provided between the touch electrodes and the thin film transistor layer. Specifically, referring to FIG. 17, the shielding layer 400 is disposed under the touch electrodes 310 and completely covers the touch electrodes 310 to achieve the best shielding effect. That is, an orthographic projection of the touch electrode 310 on the substrate 210 is within an orthographic projection of the shielding layer 400 on the substrate 210. In order to reduce a formation process, the shielding layer 400 and the transparent conductive layer 222 may be arranged in the same layer. That is, the transparent conductive layer 222 also includes a third transparent conductive sublayer. The third transparent conductive sublayer includes the shielding layer.

Figure 17:
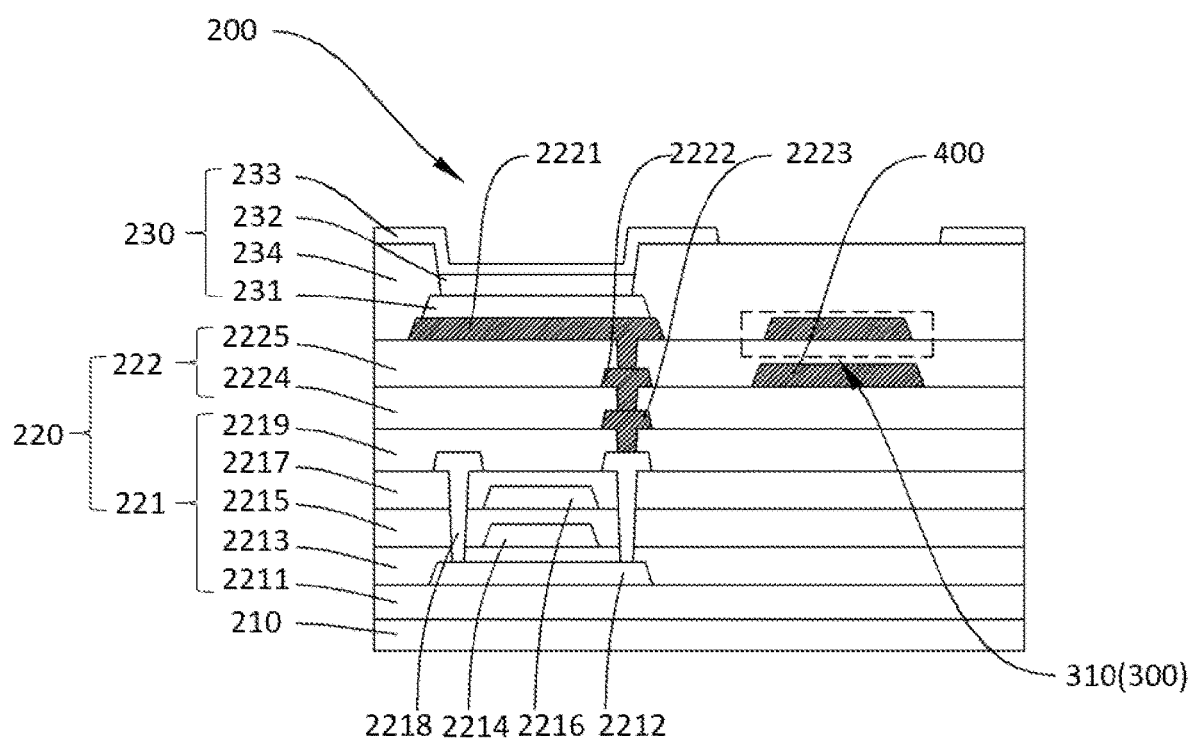
FIG. 17 is a schematic structural diagram showing a cross-sectional view of another display panel of an embodiment of the present disclosure.

It is understandable that the above limitation that the third transparent conductive sublayer includes the shielding layer does not mean that the transparent conductive layer must include three or more transparent conductive sublayers, but it is only to distinguish it from the first transparent conductive sublayer and the second transparent conductive sublayer in the foregoing embodiments. The third transparent conductive sublayer including the shielding layer may be any transparent conductive sublayer used to form the touch layer in the transparent conductive sublayer. For example, as shown in FIG. 17, the first transparent conductive sublayer 2221 includes the touch layer 300. The second transparent conductive sublayer 2222 includes the shielding layer 400. Of course, it can also be other setting methods, which will not be repeated here.

In some embodiments, in a same unit area, a number of the second pixels is the same as a number of the first pixels. That is, in the display panel of this embodiment, the normal display area and the light-transmitting function display area have the same pixel density (pixels per inch, PPI). That is, the light-transmitting function display area does not cause a decrease in PPI due to the higher light transmittance, so that a better display performance can be ensured.

It should be noted that only the foregoing structures are described in the foregoing display panels of the embodiments. It can be understood that, in addition to the foregoing structures, the display panel of the embodiments of the present disclosure may also include any other necessary structures as required. For example, a thin film encapsulation layer, a flip chip film, etc., which are not specifically limited here.

An embodiment of the present disclosure provides a mobile terminal, including the display panel described in the foregoing embodiments and a terminal body. The terminal body and the display panel are assembled together. The terminal body may include a middle frame, a sealant, etc. The mobile terminal may be a mobile display terminal such as a mobile phone or a tablet. The embodiment of the present disclosure does not limit this.

The above describes in detail the display panel and the display device of the embodiments of the present disclosure.

In this specification, specific examples are used to illustrate the principles and implementations of the present disclosure. The description of the above embodiments is only used to help understand the method and core idea of the present disclosure. At the same time, for those skilled in the art, based on the idea of the present disclosure, there will be changes in the specific implementation and the scope of application. In summary, the content of this specification should not be construed as a restriction on the present disclosure.

What is claimed is:

1. A display panel, comprising a normal display area and a light-transmitting function display area, wherein the display panel comprises:
    an array driving layer comprising a thin film transistor layer and a transparent conductive layer disposed on a surface of the thin film transistor layer;
    a first electrode layer disposed on a surface of the array driving layer, wherein the transparent conductive layer is arranged between the first electrode layer and the thin film transistor layer;
    a light-emitting layer disposed on a surface of the first electrode layer away from the array driving layer, and comprising first pixels arranged on the normal display area and second pixels arranged on the light-transmitting function display area;
    a second electrode layer disposed on a surface of the light-emitting layer away from the array driving layer, and a via hole formed in the light-transmitting function display area and between two adjacent of the second pixels;
    wherein in the light-transmitting function display area, the transparent conductive layer comprises a plurality of touch electrodes corresponding to the via hole;
    wherein the plurality of touch electrodes comprise a plurality of first sub-touch electrodes and a plurality of second sub-touch electrodes, the plurality of first sub-touch electrodes are arranged to be a plurality of first sub-touch electrode groups along a first direction, the plurality of second sub-touch electrodes are arranged to be a plurality of second sub-touch electrode groups along the first direction;
    for each of the plurality of first sub-touch electrode groups, two first sides of the first sub-touch electrode group in the first direction are each provided with a first touch trace, the first touch trace extends along a second direction perpendicular to the first direction, the first touch trace at one of the two first sides is connected to odd-numbered ones of the first sub-touch electrodes in the first sub-touch electrode group, and the first touch trace at another one of the two first sides is connected to even-numbered ones of the first sub-touch electrodes in the first sub-touch electrode group;
    each of the plurality of second sub-touch electrode groups comprises a plurality of touch units, for each of the plurality of touch units, the touch unit comprises three of the plurality of second sub-touch electrodes, two second sides of the touch unit in the first direction are provided with respective second touch traces, two ends of one of the second touch traces at one of the two second sides are connected to odd-numbered two of the three second sub-touch electrodes respectively, and two of the second touch traces at another one of the two second sides are extended in the second direction and connected to a remaining one of the three second sub-touch electrodes and a first one of the odd-numbered two second sub-touch electrodes, respectively;

the first sub-touch electrode, the second sub-touch electrode, the first touch trace, and the second touch trace are arranged in a same layer.

2. The display panel according to claim 1, wherein an orthographic projection of the touch electrode on the second electrode layer is within a corresponding via hole.

3. The display panel according to claim 2, wherein the touch electrodes comprise a plurality of touch sub-electrodes arranged at intervals, an orthographic projection of the touch sub-electrode on the light-emitting layer is outside the second pixel, any two adjacent touch sub-electrodes are electrically connected, the via hole comprises a plurality of sub-via holes corresponding to the plurality of touch sub-electrodes, and an orthographic projection of the touch sub-electrode on the second electrode layer is within the corresponding sub-via hole.

4. The display panel according to claim 3, wherein in one of the touch sub-electrodes and a corresponding one of the sub-via holes, the touch sub-electrode and the sub-via hole have a same shape, and/or a line connecting a center of the touch sub-electrode and a center of the corresponding sub-via hole is perpendicular to the display panel.

5. The display panel according to claim 4, wherein the shape of the sub-via hole is square, rectangular, circular, elliptical, or triangular.

6. The display panel according to claim 1, wherein the thin film transistor layer comprises a first thin film transistor corresponding to a respective one of the first pixels and a second thin film transistor corresponding to a respective one of the second pixels;
the first electrode layer comprises a first sub-electrode corresponding to a respective one of the first pixels and a second sub-electrode corresponding to a respective one of the second pixels; and
in the light-transmitting function display area, the second sub-electrode is electrically connected to a corresponding second thin film transistor through the transparent conductive layer.

7. The display panel according to claim 1, wherein the transparent conductive layer comprises a first transparent conductive sublayer and a second transparent conductive sublayer.

8. The display panel according to claim 7, wherein the first transparent conductive sublayer comprises the plurality of touch electrodes, the second transparent conductive sublayer comprises a plurality of touch traces, and each of the touch traces is electrically connected to a corresponding touch electrode.

9. The display panel according to claim 7, wherein the transparent conductive layer further comprises a third transparent conductive sublayer, the third transparent conductive sublayer comprises a shielding layer, and the shielding layer is disposed between the touch electrode and the thin film transistor layer.

10. The display panel according to claim 1, wherein in one unit area, a number of the second pixels is the same as a number of the first pixels.

11. The display panel according to claim 1, wherein the transparent conductive layer is made of indium tin oxide, nano silver, or carbon nanotubes.

12. The display panel according to claim 1, wherein the thin film transistor layer comprises a buffer layer, an active layer, a first gate insulating layer, a first gate layer, a second gate insulating layer, a second gate layer, an interlayer insulating layer, a source-drain layer, and a planarization layer which are sequentially stacked.

13. The display panel according to claim 1, wherein the light-emitting layer comprises a hole injection layer, a hole transport layer, a light-emitting material layer, an electron transport layer, and an electron injection layer which are sequentially stacked.

14. A mobile terminal, comprising a display panel and a terminal body, wherein the terminal body and the display panel are assembled together;
wherein the display panel comprises:
an array driving layer comprising a thin film transistor layer and a transparent conductive layer disposed on a surface of the thin film transistor layer;
a first electrode layer disposed on a surface of the array driving layer, wherein the transparent conductive layer is arranged between the first electrode layer and the thin film transistor layer;
a light-emitting layer disposed on a surface of the first electrode layer away from the array driving layer, and comprising first pixels arranged on the normal display area and second pixels arranged on the light-transmitting function display area;
a second electrode layer disposed on a surface of the light-emitting layer away from the array driving layer, and a via hole formed in the light-transmitting function display area and between two adjacent of the second pixels;
wherein in the light-transmitting function display area, the transparent conductive layer comprises a plurality of touch electrodes corresponding to the via hole;
wherein the plurality of touch electrodes comprise a plurality of first sub-touch electrodes and a plurality of second sub-touch electrodes, the plurality of first sub-touch electrodes are arranged to be a plurality of first sub-touch electrode groups along a first direction, the plurality of second sub-touch electrodes are arranged to be a plurality of second sub-touch electrode groups along the first direction;
for each of the plurality of first sub-touch electrode groups, two first sides of the first sub-touch electrode group in the first direction are each provided with a first touch trace, the first touch trace extends along a second direction perpendicular to the first direction, the first touch trace at one of the two first sides is connected to odd-numbered ones of the first sub-touch electrodes in the first sub-touch electrode group, and the first touch trace at another one of the two first sides is connected to even-numbered ones of the first sub-touch electrodes in the first sub-touch electrode group;
each of the plurality of second sub-touch electrode groups comprises a plurality of touch units, for each of the plurality of touch units, the touch unit comprises three of the plurality of second sub-touch electrodes, two second sides of the touch unit in the first direction are each provided with a second touch trace, two ends of the second touch trace at one of the two second sides are connected to odd-numbered two of the three second sub-touch electrodes respectively, and two of the second touch traces at another one of the two second sides are extended in the second direction and connected to a remaining one of the three second sub-touch electrodes and a first one of the odd-numbered two second sub-touch electrodes, respectively;
the first sub-touch electrode, the second sub-touch electrode, the first touch trace, and the second touch trace are arranged in a same layer.

15. The mobile terminal according to claim 14, wherein an orthographic projection of the touch electrode on the second electrode layer is within a corresponding via hole.

16. The mobile terminal according to claim 15, wherein the touch electrodes comprise a plurality of touch sub-electrodes arranged at intervals, an orthographic projection of the touch sub-electrode on the light-emitting layer is outside the second pixel, any two adjacent touch sub-electrodes are electrically connected, the via hole comprises a plurality of sub-via holes corresponding to the plurality of touch sub-electrodes, and an orthographic projection of the touch sub-electrode on the second electrode layer is within the corresponding sub-via hole.

17. The mobile terminal according to claim 15, wherein the thin film transistor layer comprises a first thin film transistor corresponding to a respective one of the first pixels and a second thin film transistor corresponding to a respective one of the second pixels;

the first electrode layer comprises a first sub-electrode corresponding to a respective one of the first pixels and a second sub-electrode corresponding to a respective one of the second pixels; and in the light-transmitting function display area, the second sub-electrode is electrically connected to a corresponding second thin film transistor through the transparent conductive layer.

18. The display panel according to claim 1, wherein a size of each of the plurality of first sub-touch electrodes is equal, and sizes of the odd-numbered two second sub-touch electrodes are less than a size of the remaining one of the three second sub-touch electrodes.

19. The display panel according to claim 1, wherein each of the plurality of first sub-touch electrode groups and a corresponding one of the plurality of second sub-touch electrode groups are formed to an electrode-group pair, a distance between the first sub-touch electrode group and the corresponding second sub-touch electrode group in the electrode-group pair is less than a distance between the electrode-group pair and another adjacent electrode-group pair.

* * * * *